(12) United States Patent
Zhao et al.

(10) Patent No.: US 12,330,931 B2
(45) Date of Patent: Jun. 17, 2025

(54) MEMS MICROPHONE

(71) Applicant: AAC ACOUSTIC TECHNOLOGIES (SHENZHEN) CO., LTD., Shenzhen (CN)

(72) Inventors: Zhuanzhuan Zhao, Shenzhen (CN); Rui Zhang, Shenzhen (CN)

(73) Assignee: AAC ACOUSTIC TECHNOLOGIES (SHENZHEN) CO., LTD., Shenzhen (CN)

(*) Notice: Subject to any disclaimer, the term of this patent is extended or adjusted under 35 U.S.C. 154(b) by 563 days.

(21) Appl. No.: 17/879,788

(22) Filed: Aug. 3, 2022

(65) Prior Publication Data
US 2023/0212003 A1    Jul. 6, 2023

(30) Foreign Application Priority Data
Dec. 31, 2021  (CN) .......................... 202123451382.4

(51) Int. Cl.
*B81B 3/00* (2006.01)
(52) U.S. Cl.
CPC .... *B81B 3/0072* (2013.01); *B81B 2201/0257* (2013.01); *B81B 2203/0315* (2013.01); *B81B 2203/0353* (2013.01); *B81B 2203/04* (2013.01)
(58) Field of Classification Search
CPC .......... B81B 3/0072; B81B 2201/0257; B81B 2203/0315; B81B 2203/0353; B81B 2203/04; B81B 2201/0264; B81B 3/0064; B81B 2203/0127; H04R 19/005
See application file for complete search history.

(56) References Cited

U.S. PATENT DOCUMENTS

| | | | |
|---|---|---|---|
| 8,103,027 B2* | 1/2012 | Zhang | H04R 1/222 381/175 |
| 2010/0158279 A1* | 6/2010 | Conti | H04R 19/005 381/174 |

FOREIGN PATENT DOCUMENTS

| | | | | |
|---|---|---|---|---|
| CN | 111294715 B | * | 5/2021 | ........... H04R 19/005 |
| CN | 112788508 A | * | 5/2021 | ........... B81B 3/0064 |

* cited by examiner

*Primary Examiner* — Angelica M McKinney
(74) *Attorney, Agent, or Firm* — Wiersch Law Group

(57) ABSTRACT

The present invention discloses a MEMS microphone, which includes a substrate with a back cavity, a connection part, and a capacitive system arranged in the connection part. The capacitive system includes a first electrode connected to the inner wall of connection part, and a second electrode disposed on the substrate near the first electrode and spaced from the first electrode. The second electrode has two shape separation gaps. The shape separation gap includes a splitting gap in the second electrode, and two end gaps. The second electrode is divided into an effective vibration area and an auxiliary area by adopting a cracking gap structure. While improving the sensitivity of the first electrode, the stress concentration point of the second electrode is directed to the edge of the second electrode, so as to disperse the stress under the action of loud pressure.

10 Claims, 3 Drawing Sheets

MEMS MICROPHONE

FIELD OF THE PRESENT DISCLOSURE

The invention relates to the technical field of electro-acoustic transducers, in particular to a MEMS (Micro-Electro Mechanical System) microphone.

DESCRIPTION OF RELATED ART

With the development of wireless communication, users have higher and higher requirements on the call weight of mobile phones. As the voice pickup device of mobile phones, the quality of its design directly affects the call weight of mobile phones.

At present, a microphone widely used in mobile phones is a MEMS (Micro-Electro-Mechanical System) microphone. a MEMS microphone related to the present invention includes a substrate and a capacitive system composed of a vibrating structure. The vibrating structure vibrates under the action of sound waves, which in turn changes the capacitance of the capacitive system, thereby converting the sound wave signal into an electric signal. However, in the related art, the structure of the capacitive system and the connection with the substrate are all fixed structures. Under the action of sound pressure, the vibration structure is easily concentrated in its center position, resulting in the failure of the vibration structure and affecting the performance of the microphone.

SUMMARY OF THE PRESENT INVENTION

The purpose of the present invention is to provide a MEMS microphone, which aims to solve the problem in the prior art that the vibration structure of the microphone is arranged with stress concentration during operation, which may cause the vibration structure to break and fail.

Accordingly, the present invention provides a MEMS microphone, comprising: a substrate with a back cavity; a connection part arranged on one side of the substrate and surrounding an outer side of the back cavity; a capacitive system arranged in the connection part, including a first electrode connected to an inner wall of connection part and a second electrode disposed on the substrate close to the first electrode and spaced from the first electrode.

The second electrode includes at least two shape separation gaps spaced around a center thereof; the shape separation gap includes a splitting gap, and two end gaps respectively connected to two ends of the splitting gap and bent and extended toward an edge of the second electrode for forming a gap between the end gap and the edge of the second electrode.

As an optional improvement of the invention, the second electrode includes at least three side edges and a corner formed between adjacent side edges; the two end gaps of the shape separation gap respectively extend to the corresponding corners of the two ends of the side edge.

As an optional improvement of the invention, an extension direction of the splitting gap is parallel to the corresponding side edge, and a distance between each splitting gap and the corresponding side edge is equal.

As an optional improvement of the invention, lengths of the side edges are equal, the side edges are arranged at equal angular intervals around the center of the second electrode, and the shape separation gap is opposite to the corresponding the symmetrical arrangement of the side edges of the symmetrical axle.

As an optional improvement of the invention, a connection between the end gap and the splitting gap is a smooth transition.

As an optional improvement of the invention, the MEMS microphone includes a gap formed between the end gaps of the adjacent shape separation gaps.

As an optional improvement of the invention, the shape separation gap further includes a stress dispersion structure connected to an end of the end gap away from the splitting gap.

As an optional improvement of the invention, the stress dispersion structure includes an open hole connected to one end of the end gap away from the splitting gap, and the open hole is arranged with a smooth edge; or, the stress dispersion structure includes a dispersion gap that is bent and extended to one side from an end of the end gap away from the splitting gap, and the edge of the dispersion gap is smooth.

As an optional improvement of the invention, the first electrode includes a main body and at least two support feet parts extending outward from the main body; the adjacent support feet parts are recessed toward the center of main body to form a sunken part; the splitting gap is set in a one-to-one correspondence with the sunken part, and the end gap is set in a one-to-one correspondence with the support feet part.

As an optional improvement of the invention, the main body includes a plurality of through holes, and the through holes are arranged at intervals around the center of the second electrode.

BRIEF DESCRIPTION OF THE DRAWINGS

Many aspects of the exemplary embodiment can be better understood with reference to the following drawings. The components in the drawing are not necessarily drawn to scale, the emphasis instead being placed upon clearly illustrating the principles of the present disclosure.

DETAILED DESCRIPTION OF THE EXEMPLARY EMBODIMENTS

Figure 1:
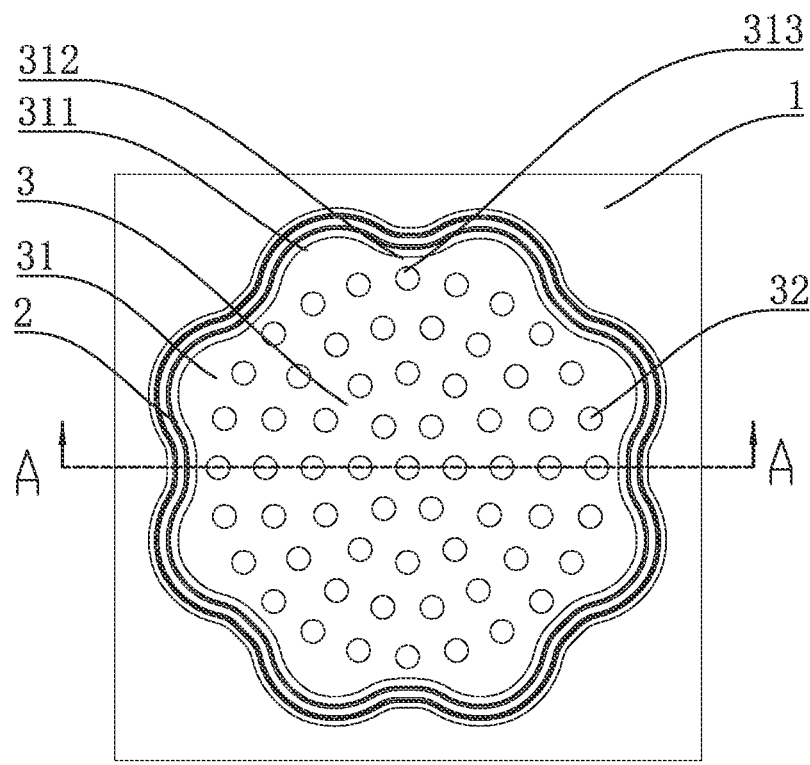
FIG. 1 is an overall structural view of a MEMS microphone provided by an embodiment of the application.
Figure 2:
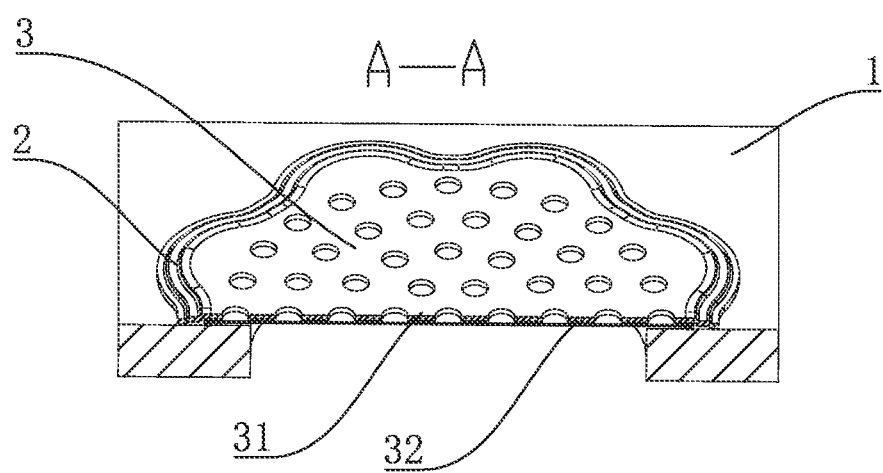
FIG. 2 is a cross-sectional view of the MEMS microphone, taken along line A-A in FIG. 1.

The present disclosure will hereinafter be described in detail with reference to exemplary embodiments. To make the technical problems to be solved, technical solutions and beneficial effects of the present disclosure more apparent, the present disclosure is described in further detail together with the figures and the embodiments. It should be understood the specific embodiments described hereby are only to explain the disclosure, not intended to limit the disclosure.

Please refer to FIGS. 1-5. A MEMS microphone is provided. The MEMS microphone includes a substrate 1 with a back cavity, a connection part 2 disposed on one side of the substrate 1 and surrounding an outer side of the back cavity, and a connection part 2 disposed on the back cavity within the capacitive system 3. The capacitive system 3 includes a first electrode 31 connected to the inner wall of the connection part 2 and a second electrode 32 provided on the substrate 1 near the first electrode 31 and spaced from the first electrode 31. The second electrode 32 is arranged with at least two shape separation gaps 321 spaced around its center. the shape separation gap 321 includes a splitting gap 3211 located in the second electrode 32 and two end gaps 3212 connected to both ends of the splitting gap 3211 and bent and extended toward the edge of the second electrode 32. There is a gap between the end gap and the edge of the second electrode. In this embodiment, under the premise of not affecting the performance of the microphone, the rigidity of the first electrode 31 and the second electrode 32 is increased by appropriately reducing the effective area of the first electrode 31 and the second electrode 32 in the capacitive system 3, so that under the action of the sound pressure, the to the role of decentralized stress.

Figure 3:
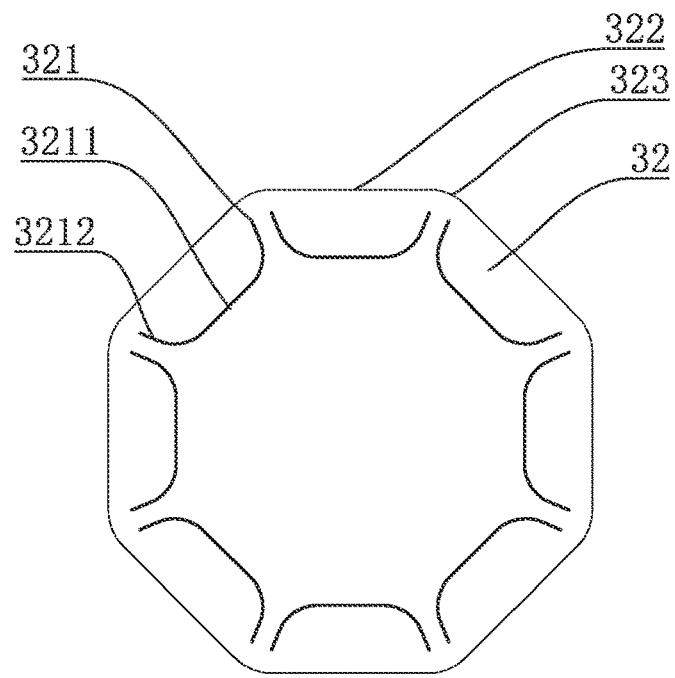
FIG. 3 illustrates a first implementation of a second electrode of the MEMS microphone.

Please refer to FIG. 3. The second electrode 32 is arranged with at least three side edges 322, corners 323 are formed between adjacent sides 322, each shape separation gap 321 corresponds to each side edge 322 one-to-one, the two end gaps 3212 of the shape separation gap 321 respectively extend to the corners 323 at both ends of the corresponding side edge 322. The extension direction of the splitting gap 3211 is parallel to the corresponding side edge 322, and the distances between each splitting gap 3211 and the corresponding side edge 322 are equal. The lengths of each side edge 322 are equal, and each side edge 322 is arranged at equal angular intervals around the center of the second electrode 32, and the shape separation gap 321 is symmetrically arranged with respect to the symmetrical axle of the corresponding side edge 322. In this embodiment, by opening the shape separation gap 321 on the second electrode 32 of the octagon, under the action of the loud pressure, the stress concentration point concentrated in the center of the second electrode 32 is directed to the chamfer of the octagon, thereby improving the stability of the second electrode 32. In addition, it is further defined that the lengths of the side edges 322 are equal and are arranged at equal angular intervals around the center of the second electrode 32. The corresponding shape separation gap 321 is symmetrically arranged with respect to the symmetrical axle of the corresponding side edge 322 to further enhance the stress dispersed on the second electrode 32. uniformity. The embodiment takes the octagonal electrode structure as an example, and the specific embodiment is not limited to the shape, and is also applicable to any polygonal structure.

In the prior art, taking the fully fixed electrode structure of the octagon as an example, under the action of a loud sound pressure, the second electrode 32 is easily concentrated at the center of the eight sides, thereby causing the second electrode 32 to break and fail. Therefore, it is necessary to improve the above problems.

Please refer to FIG. 1, the overall structural diagram of the MEMS microphone provided by FIG. 1 for the embodiment of the application. In the embodiment, the shape of the first electrode 31 is correspondingly set as an octagon, and the first electrode 31 includes a main body and at least two support feet parts 311 extending outward from the main body. A sunken part 312 is formed between the adjacent support feet parts 311, which are recessed toward the center of the main body. Splitting gap 3211 is set in one-to-one correspondence with sunken part 312, and end gap 3212 is set in one-to-one correspondence with support feet part 311. The main body is provided with a plurality of through holes 313, and the through holes are arranged at intervals around the center of the second electrode 32. The plurality of through holes 313 are sound holes of the microphone. By setting the shape of the first electrode 31 corresponding to the second electrode 32, the overall performance of the MEMS microphone is further improved. The embodiment takes the octagonal electrode structure as an example, and the specific embodiment is not limited to the shape, and is also applicable to any polygonal structure.

Please refer to FIG. 3. In an optional embodiment, the junction between the end gap 3212 and the splitting gap 3211 is arranged with a smooth transition. The angle between the extension direction of the end gap 3212 and the extension direction of the separation slit 3211 is greater than 90°. A space is formed between end gaps 3212 of adjacent shape separation gaps 321. The splitting gap 3211 is the same width as the end gap 3212. In this embodiment, by further defining the connection uniformity and relative position of the end gap 3212 and the splitting gap 3211, the uniformity of the stress dispersion of the second electrode 32 is further improved, thereby improving the reliability of the microphone.

Figure 4:
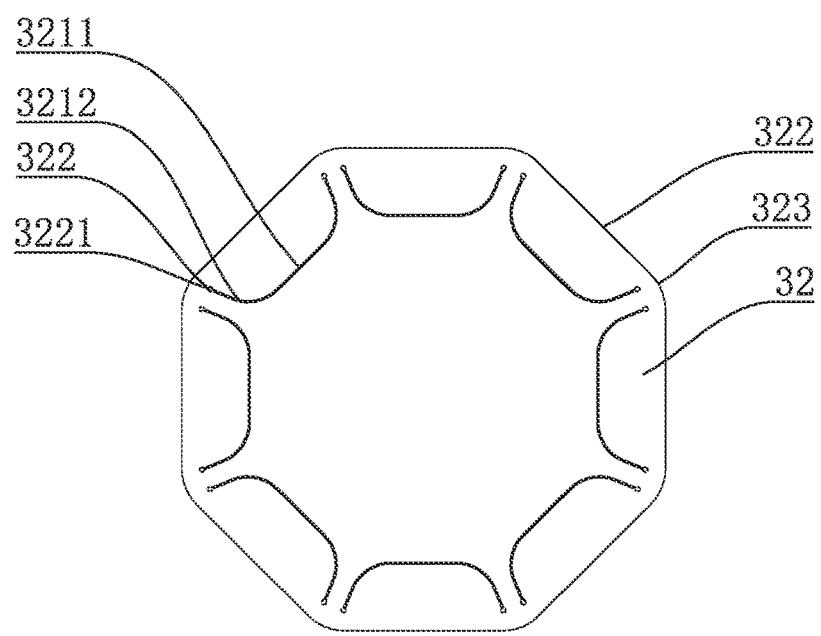
FIG. 4 illustrates a second implementation of the second electrode of the MEMS microphone.
Figure 5:
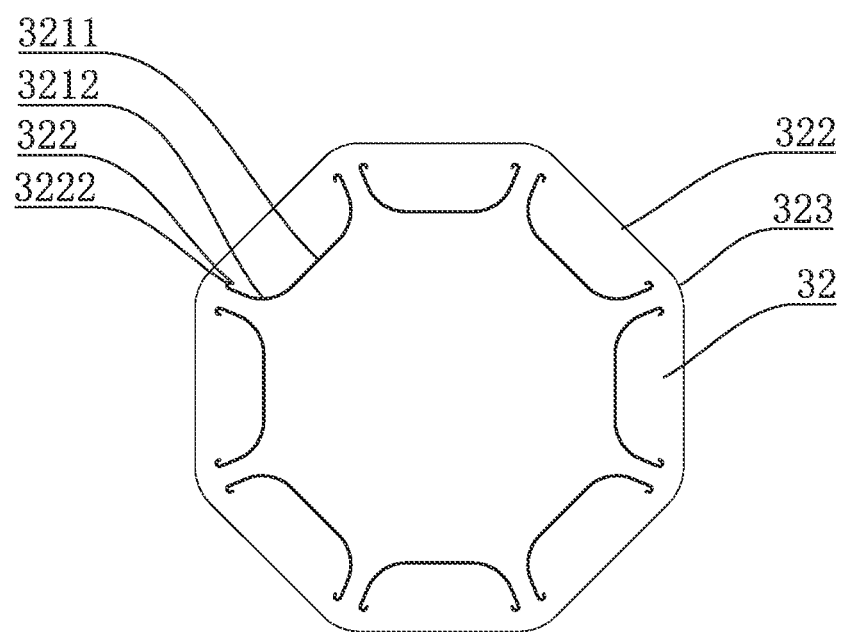
FIG. 5 illustrates a third implementation of the second electrode of the MEMS microphone.

Please refer to FIG. 4. The shape separation gap 321 further includes a stress dispersion structure 322 connected to one end of the end gap 3212 away from the splitting gap 3211. The stress dispersion structure includes an open hole 3221 connected to the end of the end gap 3212 away from the splitting gap 3211, and the open hole is arranged with a smooth edge; alternatively, please refer to FIG. 5, which is a structural diagram of the third embodiment of the second electrode 32 in the application. The stress dispersion structure includes a dispersion gap 3222 that is bent and extended from one end of the end gap 3212 away from the splitting gap 3211 to one side, and the edge of the dispersion gap 3222 is smooth. In this embodiment, through the above two embodiments, the second electrode 32 is divided into an effective vibration area and an auxiliary area, so that the sensitivity of the second electrode 32 is improved, and the stress concentration point of the second electrode 32 is directed to the octagon chamfer. But at the same time to improve the structure of the second electrode 32, the stress concentration point will also exist at the connection between the effective vibration area and the auxiliary area. Therefore, by increasing the effective area of the stress dispersion structure position, it plays the role of dispersing the stress.

It is to be understood, however, that even though numerous characteristics and advantages of the present exemplary embodiments have been set forth in the foregoing description, together with details of the structures and functions of the embodiments, the disclosure is illustrative only, and changes may be made in detail, especially in matters of shape, size, and arrangement of parts within the principles of the invention to the full extent indicated by the broad general meaning of the terms where the appended claims are expressed.

What is claimed is:

1. A MEMS microphone, comprising:
   a substrate with a back cavity;
   a connection part arranged on one side of the substrate and surrounding an outer side of the back cavity;
   a capacitive system arranged in the connection part, including a first electrode connected to an inner wall of connection part and a second electrode disposed on the substrate close to the first electrode and spaced from the first electrode; wherein
   the second electrode includes at least two shape separation gaps spaced around a center thereof; the shape separation gap includes a splitting gap, and two end gaps respectively connected to two ends of the splitting gap and bent and extended toward an edge of the second electrode for forming a gap between the end gap and the edge of the second electrode.

2. The MEMS microphone as described in claim 1, wherein the second electrode includes at least three side edges and a corner formed between adjacent side edges; the two end gaps of the shape separation gap respectively extend to the corresponding corners of the two ends of the side edge.

3. The MEMS microphone as described in claim 2, wherein an extension direction of the splitting gap is parallel to the corresponding side edge, and a distance between each splitting gap and the corresponding side edge is equal.

4. The MEMS microphone as described in claim 3, wherein lengths of the side edges are equal, the side edges are arranged at equal angular intervals around the center of the second electrode, and the shape separation gap is opposite to the corresponding the symmetrical arrangement of the side edges of the symmetrical axle.

5. The MEMS microphone as described in claim 1, wherein a connection between the end gap and the splitting gap is a smooth transition.

6. The MEMS microphone as described in claim 1 including a gap formed between the end gaps of the adjacent shape separation gaps.

7. The MEMS microphone as described in claim 1, wherein the shape separation gap further includes a stress dispersion structure connected to an end of the end gap away from the splitting gap.

8. The MEMS microphone as described in claim 7, wherein the stress dispersion structure includes an open hole connected to one end of the end gap away from the splitting gap, and the open hole is arranged with a smooth edge; or,
the stress dispersion structure includes a dispersion gap that is bent and extended to one side from an end of the end gap away from the splitting gap, and the edge of the dispersion gap is smooth.

9. The MEMS microphone as described in 7, wherein the first electrode includes a main body and at least two support feet parts extending outward from the main body; the adjacent support feet parts are recessed toward the center of main body to form a sunken part; the splitting gap is set in a one-to-one correspondence with the sunken part, and the end gap is set in a one-to-one correspondence with the support feet part.

10. The MEMS microphone as described in claim 9, wherein the main body includes a plurality of through holes, and the through holes are arranged at intervals around the center of the second electrode.

* * * * *